United States Patent [19]

Oka

[11] Patent Number: 4,775,979

[45] Date of Patent: Oct. 4, 1988

[54] ERROR CORRECTION SYSTEM

[75] Inventor: Takafumi Oka, Odawara, Japan

[73] Assignee: Hitachi, Ltd., Tokyo, Japan

[21] Appl. No.: 895,338

[22] Filed: Aug. 11, 1986

[30] Foreign Application Priority Data

Aug. 30, 1985 [JP] Japan .................. 60-189566

[51] Int. Cl.⁴ .............................. G06F 11/10
[52] U.S. Cl. .................................. 371/39; 371/38
[58] Field of Search ............... 371/37, 38, 39, 40, 371/44

[56] References Cited

U.S. PATENT DOCUMENTS

| | | | |
|---|---|---|---|
| 3,638,182 | 1/1972 | Burton | 371/39 |
| 4,214,228 | 7/1980 | Nara | 371/40 |
| 4,592,054 | 5/1986 | Namekawa | 371/39 |
| 4,631,725 | 12/1986 | Takamura | 371/39 |

Primary Examiner—Jerry Smith
Assistant Examiner—Robert W. Beausoliel
Attorney, Agent, or Firm—Antonelli, Terry & Wands

[57] ABSTRACT

An error correction system for a memory device of the type in which a data of plurality of bits is stored in a storage in the form of a coded word having as an end portion thereof a plurality of check bits produced in accordance with a predetermined parity check matrix H, and a random error of at most Q bits contained in a corresponding word read from the storage is corrected on the basis of a plurality of syndrome bits produced in accordance with the predetermined parity check matrix H. A parity check matrix H' is generated by adding a unit matrix which is formed of l×l bits (where l>Q), to the predetermined parity check matrix H, and the check bits and the syndrome bits are produced in accordance with the parity check matrix H', to enable correction of both a block error of at most l bits and a random error to be corrected.

4 Claims, 5 Drawing Sheets

| DATA PART D | CHECK PART C |
|---|---|

ERROR CORRECTION SYSTEM

BACKGROUND OF THE INVENTION

The present invention relates to error detection and error correction, and more particularly to an error correction system for a memory device, capable of correcting a block error which is produced in a relatively large storage area.

A memory device, for example, a semiconductor memory device usually has an error checking/correcting function. The error correcting function is performed in such a manner that an error correction code is applied or added to data in a recording operation, and the error correction code of reproduced information is checked to detect and correct an error.

As regards the error correction code, there are known codes for correcting a random error, such as the Hamming code and codes for correcting a block error, such as the Fire code. Each of memory devices is made up of a multiplicity of memory elements, a peripheral circuit and a packaging system therefor, and memory devices are not always equal to each other in abnormality/failure occurring position. That is, the memory devices have different error-distribution patterns. The error is roughly classified into a single or random error caused by the abnormality or failure which occurs in abnormality or failure which occurs in the peripheral circuit or the packaging system. Accordingly, it is desirable that a memory device has a function of correcting both the random error and the block error. However, conventional error correction codes fail in the efficient, inexpensive correction of both of these errors.

An error correction system has been proposed in Chen Chin-Long U.S. Pat. No. 4,509,172 issued Apr. 2, 1985 which is applied in a memory device such that a plurality of bits making up one word are allotted to memory chips, and can detect not only a single bit error but also a multiple error (so-called escape error). In this prior art system, a syndrome bit generator uses a special H-matrix designed so that the syndrome of a multiple bit error produced in a memory chip does not coincide with any syndrome of a single bit error produced in the memory chip, and delivers a syndrome on the basis of the special H-matrix and a word read from the memory device, to determine whether an error existing in the read-out word is a single bit error or a multiple bit error. Although the above system can prevent a multiple bit error from being erroneously detected as a single bit error, only the single bit error can be corrected. In other words, it is not intended for the system to correct both the single bit error and the multiple bit error.

SUMMARY OF THE INVENTION

It is an object of the present invention to provide an error correction system for a memory device which has a capability of correcting both a random error and a block error.

In order to achieve the above object, according to the present invention, there is provided an error correction system for a memory device in which a data formed of a plurality of bits is written in a storage area of the memory device in the form of a coded word having a plurality of check bits which are produced in accordance with a predetermined parity check matrix H, and a random error of not more than Q bits contained in a corresponding word read from the storage area is corrected, on the basis of a plurality of syndrome bits produced in accordance with the parity check matrix H, the error correction system comprising means for generating a parity check matrix H' by adding a unit matrix formed of l×l bits (where l>Q) to the predetermined parity check matrix H, and means for producing the check bits and the syndrome bits in accordance with the generated parity check matrix H', to enable correction of a block error of not more than bits.

BRIEF DESCRIPTION OF THE DRAWINGS

FIG. 1 is a diagram showing an example $H_1$ of a parity check matrix used in a conventional memory device.

FIG. 2 is a diagram showing a parity check matrix $H_2$ with a reduced echelon form, into which the matrix $H_1$ of FIG. 1 is transformed.

FIG. 4 is a diagram showing a parity check matrix $H_4$ with a reduced echelon form, into which the matrix $H_3$ of FIG. 3 is transformed.

DESCRIPTION OF THE PREFERRED EMBODIMENT

In order to facilitate the understanding of the present invention, explanation will first be made of a method of correcting, an error in reproduced information using a parity check matrix.

When the transposed matrix of a coded word W in the form of a linear code, a parity check matrix, and a syndrome are expressed by $W^t$, H, and S, respectively, the syndrome S is given by the following Equation (1):

$$S = H \cdot W^t \tag{1}$$

In the case where the coded word W includes a data part D formed of k bits and a check part C formed of m bits, the parity check matrix H becomes a matrix having m rows and (k+m) columns and is generally used in a reduced echelon form shown in the following Equation (2):

$$H = |P \cdot Im| \tag{2}$$

When check bits C are produced by using the following Equation (3):

$$C = P \cdot D^t \tag{3}$$

a relation of $H \cdot W^t = 0$ is obtained. In the case where no error is contained in the coded word W, the syndrome S given by the Equation (1) will be equal to zero. In the case where an error e is produced in the coded word W and thus the word W is changed to a coded word W' (=W+e), the syndrome S is given as follows:

$$S = H \cdot W'^t = H \cdot W^t + H \cdot e^t = H \cdot e^t \tag{4}$$

If the error e is a correctable error, the syndrome S will have a one-to-one correspondence relation with the error e, and hence, the error e is detected by the syndrome S. Accordingly, a reproduced, coded word W' containing the error e can be corrected to a correct, coded word W, using the relation of the following Equation (5):

$$W = W' + e \quad (5)$$

Figure 1:
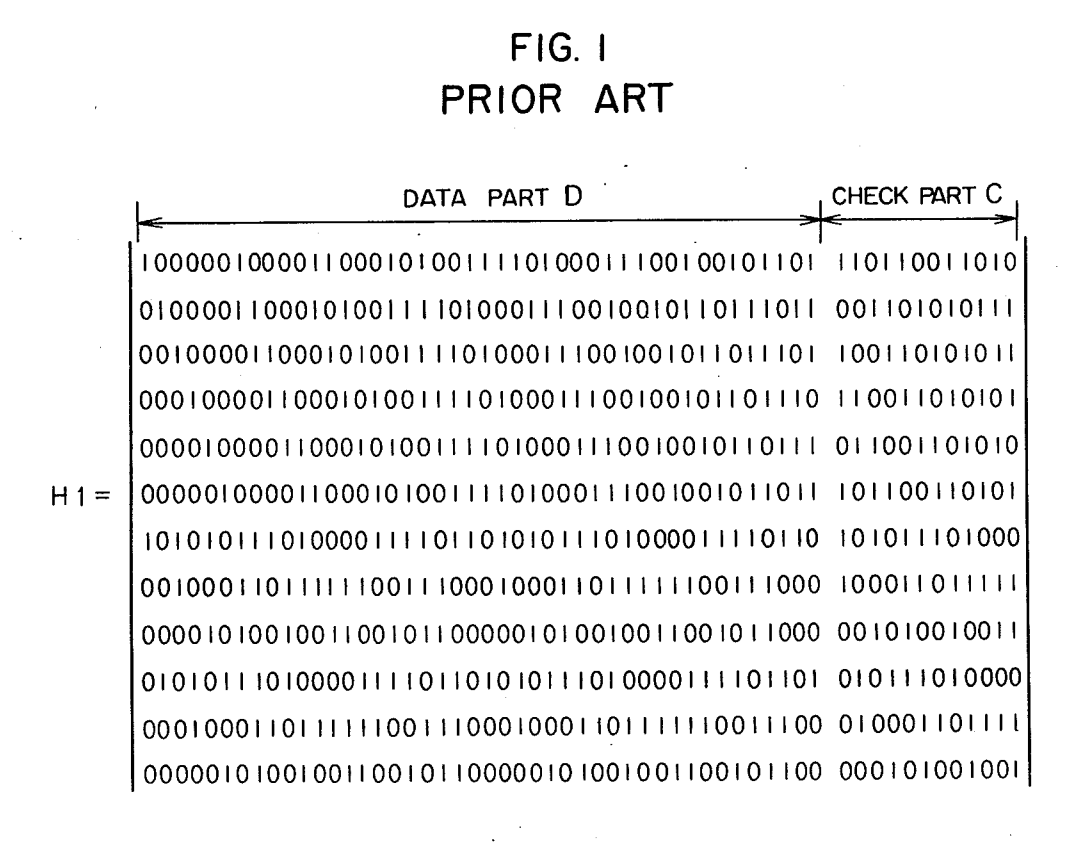

FIG. 1 shows a parity check matrix $H_1$ which has a data part D formed of 44-bit rows and can correct a random error of not more than two bits. The check part C of the matrix $H_1$ includes a plurality of 12-bit rows.

Figure 2:
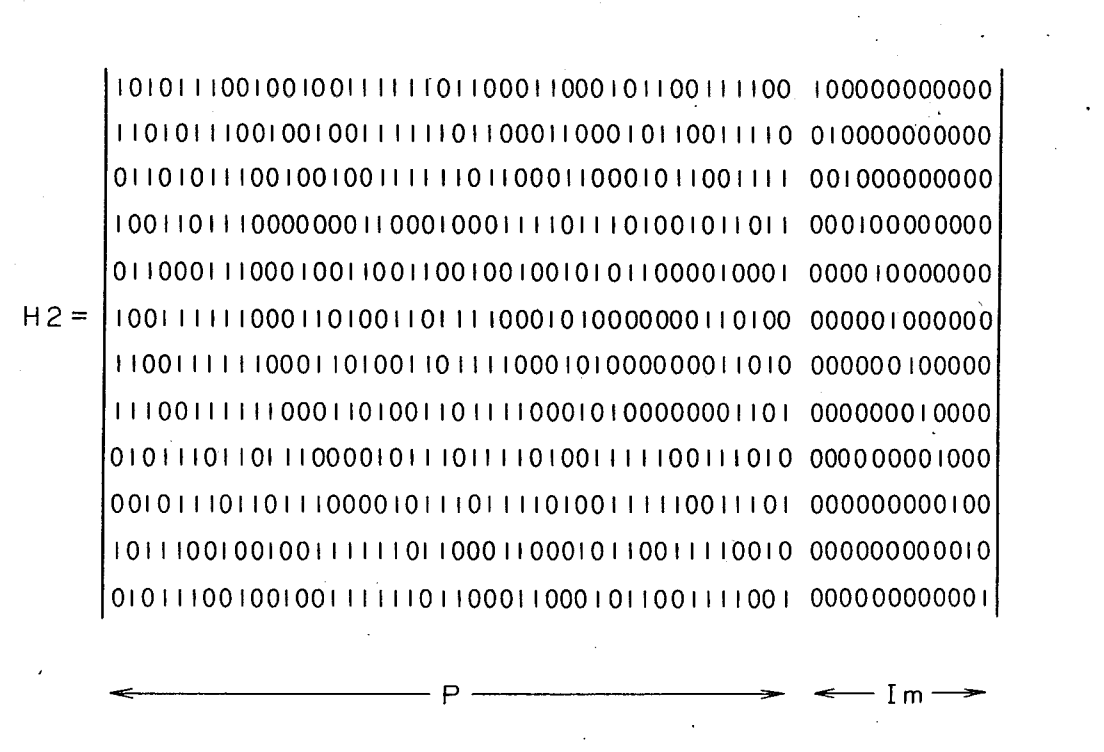

FIG. 2 shows a matrix $H_2$ consisting of a parity check matrix P and m-th order unit matrices $I_m$ in a reduced echelon form, into which the matrix $H_1$ of FIG. 1 is transformed.

The present invention is intended to correct not only a random error, but also a block error, by adding a plurality of unit matrices to the parity check matrix $H_2$.

Figure 3:
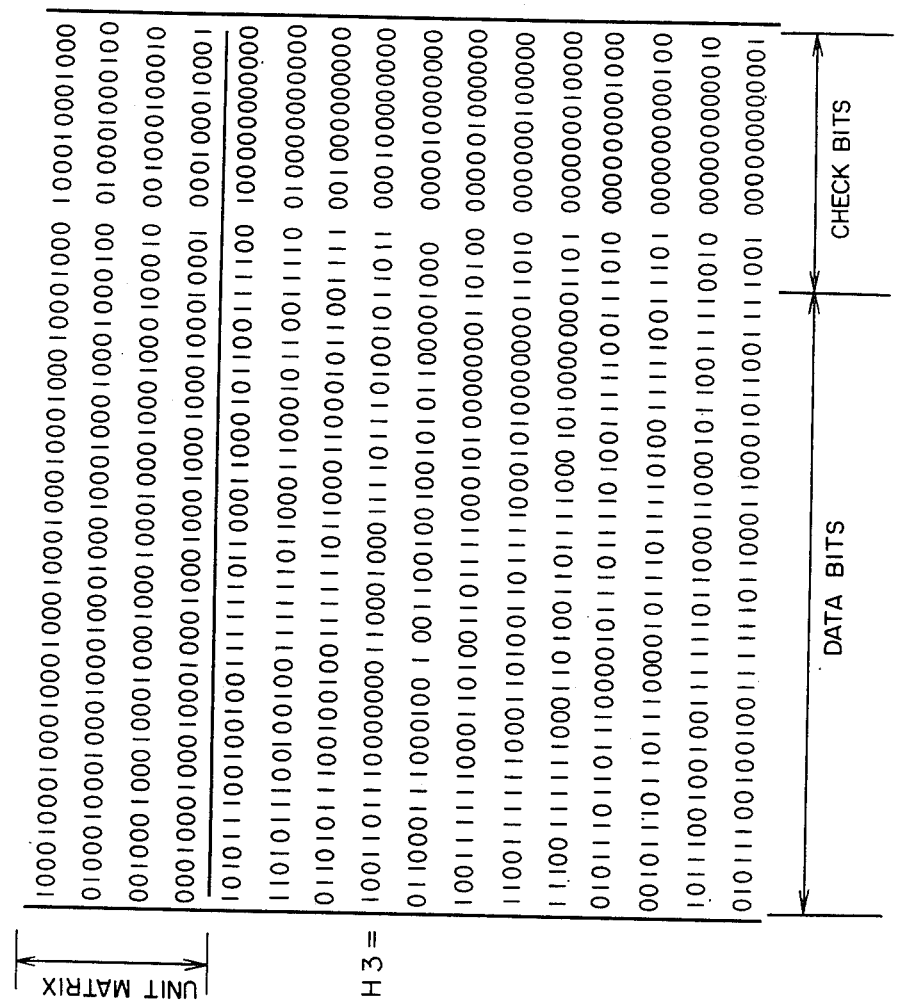
FIG. 3 is a diagram showing an example $H_3$ of a parity check matrix according to the present invention which has a block error correction capability in addition to the parity check matrix $H_2$ having a random error correction capability.

FIG. 3 shows a parity check matrix $H_3$ which is formed by adding a plurality of unit matrices each including 4×4 bits to the matrix $H_2$, in order to correct both a random error of not more than two bits and a block error of not more than four bits. As shown in FIG. 3, each row of the matrix $H_3$ includes 40 data bits (data length) and 16 check bits.

FIG. 4 shows a matrix $H_4$ of reduced echelon form, into which the matrix $H_3$ of FIG. 3 is transformed. In an error correction system for a memory device according to the present invention, check bits and syndrome bits are generated in accordance with the matrix $H_4$.

It will become evident from the following explanation that the above matrix $H_4$ which is obtained by adding unit matrices to a conventional parity check matrix for random error correction, has a correction capability of correcting a block error.

When the matrix $H_4$ is formed by adding a plurality of unit matrices each including 1×1 bits to the conventional matrix $H_2$, a syndrome S corresponding to a block error which includes at most l bits, is expressed by the following Equation (6) on the basis of the Equation (4).

$$S = \begin{bmatrix} * \\ * \\ \cdot \\ \cdot \\ \cdot \\ \cdot \\ * \\ \alpha^{i+ln} \end{bmatrix} \begin{array}{c} \uparrow \\ EP\ (l\ \text{bits}) \\ \downarrow \end{array} \quad (6)$$

A block error pattern is shown in the error pattern (EP) part of the Equation (6), as it is. That is, the EP part of the syndrome S has different shapes for different block error patterns. Further, in the $\alpha^{i+ln}$ part of the syndrome S, a reference character $\alpha$ designates a primitive element of m-th order, i a value dependent upon the error pattern and others, and n a value indicative of the position of a block error. Accordingly, even when two block errors have the same pattern, different syndromes will be produced for the block errors, if two block errors are generated at different positions.

Further, in the case where a block error is generated and the number of bits included in the block error is equal to or less than the number Q of bits included in a correctable random error, the error pattern of the block error has a one-to-one correspondence relation with the syndrome, in the same form as the random error. In the case where the number of bits included in the block error is greater than the above number Q, the number of bits "1's" included in the EP part of the Equation (6) is greater than the number Q, and a syndrome is produced which is different from the syndrome for a correctable random error (i.e. when the number of bits "1's" is not more than Q bits). That is, the matrix $H_4$ can produce a syndrome corresponding to error pattern, for each of a random error and a block error, and has a capabiity of correcting both the random error and the block error.

Figure 5:
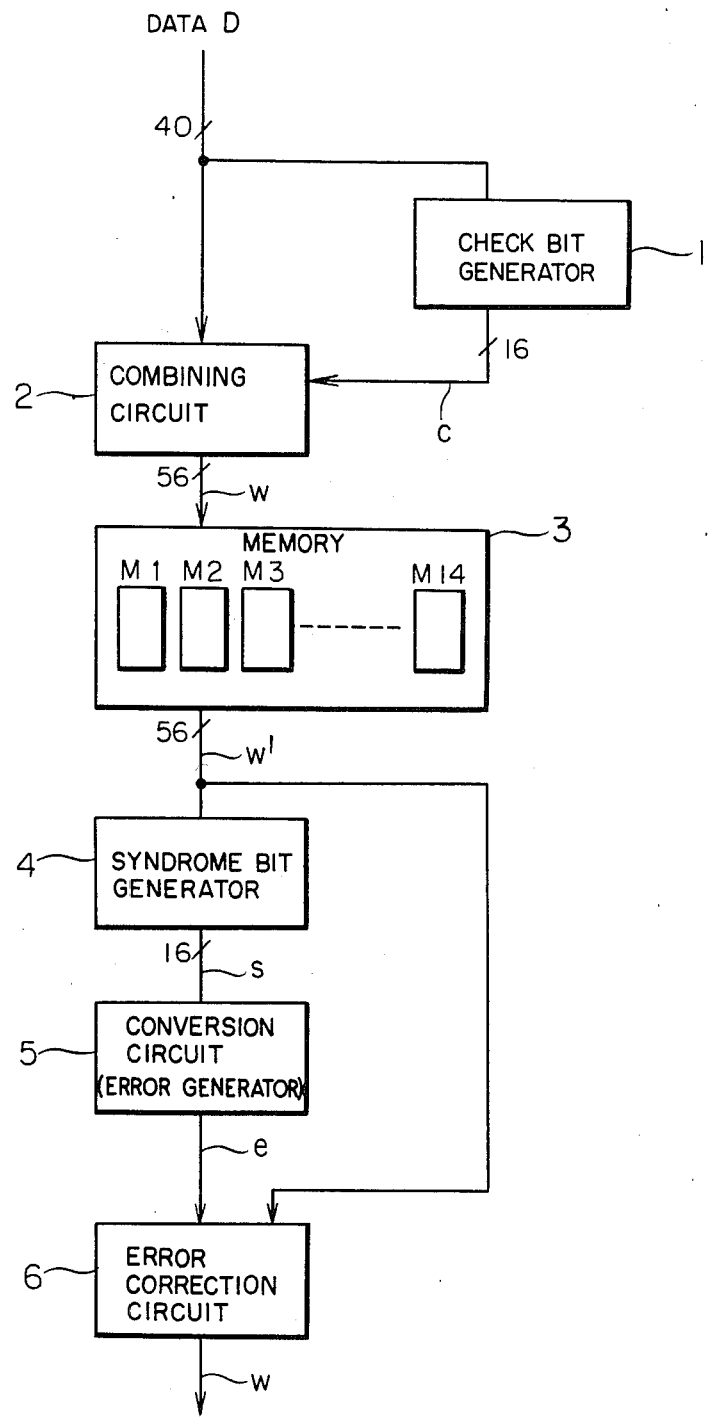
FIG. 5 is a block diagram showing an error correction system for a memory device according to an embodiment of the present invention using the matrix $H_4$ of FIG. 4.

FIG. 5 shows in a block diagram, an embodiment of an error correction system according to the present invention. Referring to FIG. 5, a data formed of 40 bits is applied to a check bit generator 1, and 16 check bits C are produced by the generator 1 on the basis of the Equation (3) which uses the P part of the matrix $H_4$. The check bits C are sent to a combining circuit 2, to be added to the data D. Thus, a coded word W formed of 56 bits is delivered from the combining circuit 2, and is sent to a memory 3, to be stored therein in the following manner. That is, the coded word W is divided into 14 parts each including 4 bits, and each part is written in one of 14 memory cards (i.e. a printed circuit board carrying semiconductor memory components) M1 to M14 which make up the memory (namely, a storage area) 3. In the case where the data D has a bit pattern of "1000000100000000000010000000000001000000011", by way of example, the check bits C having a bit pattern of "0101111101010110" are produced. Thus, the coded word W includes 40 data bits and 16 check bits, and hence is a 56-bit word.

A coded word W' read out of the memory 3 is applied to a syndrome bit generator 4 and an error correction circuit 6 in parallel. The syndrome bit generator 4 produces a syndrome S formed of 16 bits, on the basis of the Equation (1). In the case where the read-out word W' contains no error, the syndrome S is equal to zero. While, in the case where the word W' contains error, the syndrome S is not equal to zero. However, even when an error e is produced in the word W', any error e has a one-to-one correspondence relation with the syndrome S as has been explained on the basis of the Equation (4), provided that the error e is a correctable error. Thus, the error e can be found (detected) by the syndrome S, and the correct word W can be obtained from the word W' using the Equation (5). A conversion circuit 5 shown in FIG. 5 is used for obtaining the error e from the syndrome S, and the error correction circuit 6 is used for obtaining the correct word W by using the word W' and the error e.

Now, let us consider the case where the 56-bit word W having the above-mentioned bit pattern is read from the memory 3, together with an error e which is produced, for example, at the eighth memory card M8 (corresponding to the twenty-ninth to the thirty-second bits of the word W) and has an error pattern of "00000000000000000000000000001011000000000000000-0000000000". The read-out word W' will have a bit pattern of "10000001000000000000100000000100100000011010111-1101010110", and the syndrome bit generator 4 will deliver a syndrome S having a bit pattern of "110101001111", on the basis of the Equation (1).

The above syndrome S has one-to-one correspondence to the 4-bit block error which has been produced in the eighth memory card M8. The error e delivered from the conversion circuit 5 is applied to the error correction circuit 6, to perform the arithmetic operation W=W'+e which is given by the Equation (5), thereby obtaining the following correct word W: "10000001000000000001000000000010000000110101111101010110".

As is evident from the above explanation, according to the present embodiment, not only a random error but also a block error including at most four bits can be corrected using a matrix obtained by adding a plurality of unit matrices each including 4×4 bits to a conventional parity check matrix, in place of the conventional matrix, and using check bit which are four bits greater in number than conventional check bits.

In the present embodiment, the check bit generation circuit 1 and the syndrome bit generation circuit 4 are formed of different circuits.

In each of these generation circuit 1 and 4, however, a bit pattern is produced by using the same matrix $H_4$. Accordingly, the generation circuits 1 and 4 may be replaced by a single circuit which can deliver check bits in a recording operation and can deliver syndrome bits in a reproducing operation.

As has been explained in the foregoing, an error correction system according to the present invention has a function of correcting both a random error and a block error, and hence is very reliable. The error correction system is widely applicable to various memory devices, such as a magnetic disk device and a magnetic tape device as well as the semiconductor memory devices.

I claim:

1. An error correction system for use with a storage, using a first parity check matrix H having Q-bit random error correction capability in which data of a plurality of bits is written in said storage in the form of a coded work having a plurality of check bits which are produced in accordance with said first parity check matrix H, and a random error of not more than Q bits contained in a corresponding work read from the storage is corrected on the basis of a plurality of syndrome bits produced in accordance with said first parity check matrix H, said error correction system comprising:
   means for generating a second parity check matrix H' by adding unit matrices each formed of 1×1 bit (where 1>Q) to said first parity check matrix H, said second parity check matrix providing l-bit block error correction capability means, associated with said generating means, for producing the check bits and the syndrome bits in accordance with the generated second parity check matrix H' substituted for said first parity check matrix H, to correct a block error of not more than l bits and/or a random error of not more than Q bits.

2. An error correction system including a storage and means for writing a data D of a plurality of bits in said storage in the form of a coded word W having as an end portion thereof a plurality of check bits C which are produced in accordance with a predetermined parity check matrix H, in order to correct a random error which is contained in a corresponding word W' read out of the storage and includes at most Q bits, on the basis of a plurality of syndrome bits which are produced in accordance with the predetermined parity check matrix H, comprising:
   check bit generation means for adding a plurality of unit matrices to said predetermined parity check matrix H to generate a parity check matrix H' and deliver a plurality of check bits on the basis of the parity check matrix H', said unit matrix being formed of 1×1 bits (where 1>Q);
   a combining circuit for adding said check bits from said check bit generation means to said data D to be written to generate a coded word W and store said coded word W into said storage;
   said storage storing said coded word W therein including means for outputting a coded word W' corresponding to the stored word W;
   syndrome bit generation means coupled to the output of said storage for producing a syndrome S' on the basis of the coded word W' from said storage;
   error determination means responsive to said syndrome bit generation means for determining an error value e on the basis of the syndrome S'; and
   error correction means coupled to the outputs of said storage and said error determination means for generating a corrected coded word W on the basis of said coded word W' and said determined error value e to permit l-bit block error correction and/or Q random error correction.

3. An error correction system according to claim 2, wherein said data D to be written is formed of 40 bits and said check bits include 16 bits, said unit matrix added to the predetermined parity check matrix H is formed of 4×4 bits, and said parity check matrix H' is a matrix $H_4$ as shown below $$H_4 = \begin{vmatrix} 0010110010000001111001010100110001110100 & 1000000000000000 \\ 0001011001000000111100101010011000111010 & 0100000000000000 \\ 0000101100100000011110010101001100011101 & 0010000000000000 \\ 0010100100010001110110011110010111111010 & 0001000000000000 \\ 1001010010001000110110011110010111111101 & 0000100000000000 \\ 0110011011000101100100110011010100001010 & 0000010000000000 \\ 1111001101100010110010011001101010000101 & 0000001000000000 \\ 1001010100110000100000011000000100110110 & 0000000100000000 \\ 0100101010011000010000001100000010011011 & 0000000010000000 \\ 1000100111001101110001010010110000111001 & 0000000001000000 \\ 1110100001100111000001111101101001101000 & 0000000000100000 \\ 1111010000110011100000111110110100110100 & 0000000000010000 \\ 0111101000011001110000011111011010011010 & 0000000000001000 \\ 0011110100001100111000001111101101001101 & 0000000000000100 \\ 1011001000000111100101010011000111010010 & 0000000000000010 \\ 0101100100000011110010101001100011101001 & 0000000000000001 \end{vmatrix}$$

4. An error correction system according to claim 2, wherein said check bit generation means is used in common with said syndrome bit generation means in operation.

* * * * *